US012687593B2

(12) United States Patent
Park et al.

(10) Patent No.: US 12,687,593 B2
(45) Date of Patent: Jul. 21, 2026

(54) DIAGNOSTIC INTERFACE FOR SENSOR PACKAGE

(71) Applicant: Infineon Technologies AG, Neubiberg (DE)

(72) Inventors: Joo Il Park, Sungnam-Si (KR); Se Hwan Kim, Siheung-si (KR); Rainer Kling, Munich (DE); Thomas Cemernek, Neubiberg (DE); Dragos Vocurek, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 187 days.

(21) Appl. No.: 18/585,583

(22) Filed: Feb. 23, 2024

(65) Prior Publication Data

US 2025/0271516 A1 Aug. 28, 2025

(51) Int. Cl.
*G01R 33/07* (2006.01)
*G01R 15/20* (2006.01)
*G01R 33/00* (2006.01)

(52) U.S. Cl.
CPC ......... *G01R 33/072* (2013.01); *G01R 15/202* (2013.01); *G01R 33/0029* (2013.01)

(58) Field of Classification Search
None
See application file for complete search history.

(56) References Cited

U.S. PATENT DOCUMENTS

| | | | | |
|---|---|---|---|---|
| 4,916,643 | A * | 4/1990 | Ziegler ................... | G01K 1/026 |
| | | | | 374/E1.005 |
| 8,242,738 | B2 * | 8/2012 | Barsukov ............. | G01R 31/367 |
| | | | | 324/427 |
| 10,048,231 | B2 * | 8/2018 | Ferraro ................... | G01N 11/10 |
| 10,725,122 | B2 * | 7/2020 | Rubinsztain ......... | G08B 21/185 |
| 2013/0293405 | A1 * | 11/2013 | Medina Sanchez-Castro ............ | |
| | | | | H03M 1/687 |
| | | | | 341/154 |
| 2015/0340888 | A1 * | 11/2015 | Hofer ....................... | G01N 7/00 |
| | | | | 374/143 |
| 2019/0346294 | A1 * | 11/2019 | Coceani ............. | G01D 5/24428 |

FOREIGN PATENT DOCUMENTS

CN 105849588 B 11/2019

* cited by examiner

*Primary Examiner* — Richard Isla
(74) *Attorney, Agent, or Firm* — Harrity & Harrity, LLP

(57) ABSTRACT

A sensor system includes a sensor package including an integrated circuit and a plurality of external terminals including a first supply terminal, a second supply terminal, and an output terminal configured to provide an output signal. The integrated circuit includes a sensor circuit configured to modulate the output signal based on a sensor signal; a current path coupled between the first supply terminal and the second supply terminal and configured to enable a current to flow along the current path from the first supply terminal to the second supply terminal; a current modulator component arranged in the current path and configured to modulate the current flowing along the current path; and a diagnostic circuit configured to generate diagnostic information based on one or more conditions of the integrated circuit, and control the current modulator component such that the current is modulated based on the diagnostic information.

22 Claims, 6 Drawing Sheets

DIAGNOSTIC INTERFACE FOR SENSOR PACKAGE

BACKGROUND

A packaged device, such as a semiconductor package, typically includes one or more integrated circuits provided inside a package casing. The packaged device may include a plurality of external terminals that connect the one or more integrated circuits (ICs) located inside the package casing with external circuitry. For example, the plurality of external terminals may be pins or contact pads arranged at the package casing. The package casing may be a molding material that may be used to protect internal components of the packaged device, and may permit the packaged device to be handled during assembly of a larger system.

A semiconductor package may include a substrate, one or more semiconductor electronic components coupled to and/ or embedded in the substrate, and a package casing formed over the substrate to encapsulate the one or more semiconductor electronic components. The one or more semiconductor electronic components may be interconnected by electrical interconnects to form one or more semiconductor devices, such as one or more ICs (e.g., one or more dies or chips). For example, the semiconductor electronic components and the electrical interconnects may be fabricated on a semiconductor wafer to form one or more ICs before being diced into dies or chips and then packaged. A semiconductor package may be referred to as a semiconductor chip package that includes one or more ICs. A semiconductor package protects the semiconductor electronic components and the electrical interconnects from damage and includes a mechanism for connecting the semiconductor electronic components and the electrical interconnects to external components (e.g., a circuit substrate), such as via balls, pins, leads, contact pads, or other electrical interconnect structures.

SUMMARY

In some implementations, a sensor system includes a sensor package comprising an integrated circuit and a plurality of external terminals coupled to the integrated circuit, wherein the plurality of external terminals include a first supply terminal configured to be coupled to a first supply potential, a second supply terminal configured to be coupled to a second supply potential, and an output terminal configured to provide an output signal modulated based on a sensor signal, wherein the integrated circuit comprises: a sensing element configured to generate the sensor signal based on a sensed property; a sensor circuit configured to receive the sensor signal and modulate the output signal based on the sensor signal; a first current path coupled between the first supply terminal and the second supply terminal, wherein the first current path is configured to enable a first current to flow along the first current path from the first supply terminal to the second supply terminal; a first current modulator component arranged in the first current path, wherein the first current modulator component is configured to modulate the first current flowing along the first current path; and a diagnostic circuit configured to evaluate one or more conditions of the integrated circuit, generate diagnostic information based on the one or more conditions of the integrated circuit, and control the first current modulator component such that the first current is modulated based on the diagnostic information.

In some implementations, a three-terminal packaged device includes a package casing; a first supply terminal arranged at the package casing and configured to be coupled to a first supply potential; a second supply terminal arranged at the package casing and configured to be coupled to a second supply potential; an output terminal arranged at the package casing and configured to provide an output signal modulated based on output information; and an integrated circuit that is encapsulated by the package casing, wherein the integrated circuit is coupled to the first supply terminal, the second supply terminal, and the output terminal, and wherein the integrated circuit comprises: a processing circuit configured to generate the output information; a current path coupled between the first supply terminal and the second supply terminal, wherein the current path is configured to enable a current to flow along the current path from the first supply terminal to the second supply terminal; a current modulator component arranged in the current path, wherein the current modulator component is configured to modulate a voltage at the first supply terminal or at the second supply terminal by modulating the current flowing along the current path; and a diagnostic circuit configured to evaluate one or more fault conditions of the integrated circuit, generate diagnostic information based on the one or more fault conditions of the integrated circuit, and control the current modulator component such that the current is modulated based on the diagnostic information.

In some implementations, a method of providing diagnostic information from a three-terminal packaged device includes providing a first supply potential to a first supply terminal of the three-terminal packaged device; providing a second supply potential to a second supply terminal of the three-terminal packaged device; generating a sensor signal based on a sensed property; generating an output signal at an output terminal based on the sensor signal; evaluating a diagnostic condition of the three-terminal packaged device; and modulating a voltage at the first supply terminal or at the second supply terminal by modulating a current flowing between the first supply terminal and the second supply terminal, wherein the current is modulated based on a status of the diagnostic condition.

BRIEF DESCRIPTION OF THE DRAWINGS

Implementations are described herein with reference to the appended drawings.

DETAILED DESCRIPTION

Figure 1:
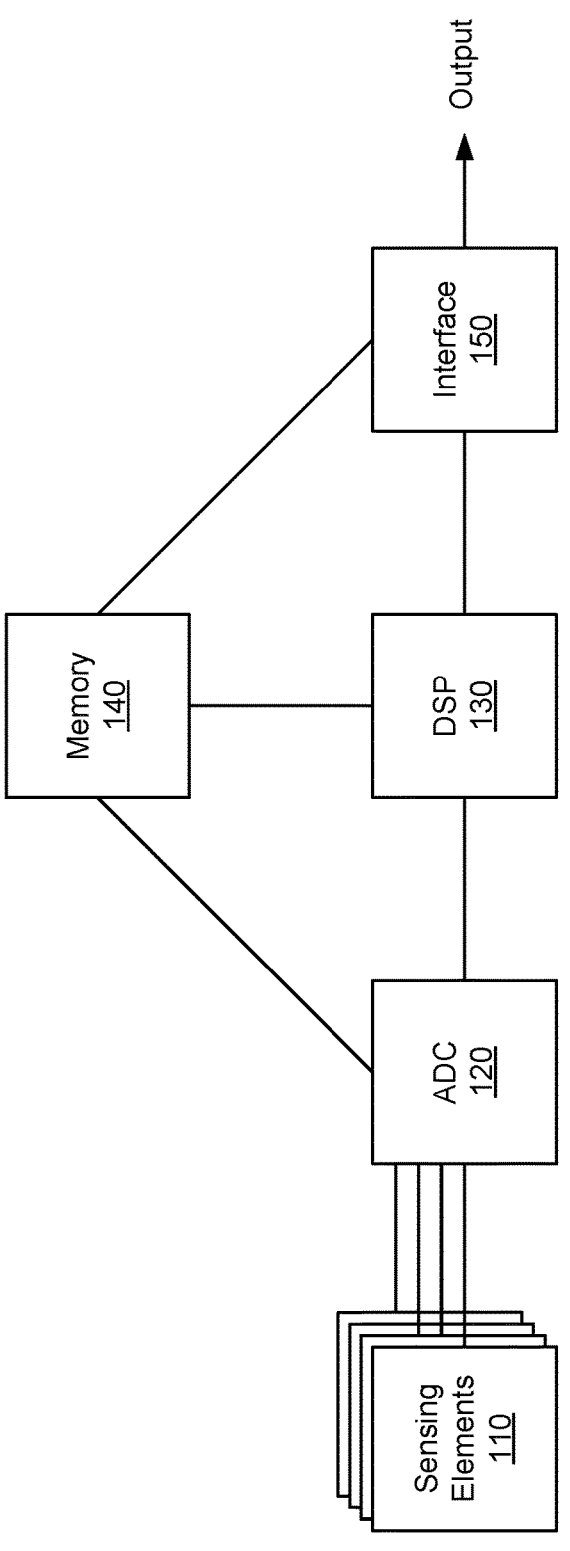
FIG. 1 is a diagram of an example sensor integrated circuit according to one or more implementations.

In the following, details are set forth to provide a more thorough explanation of example implementations. However, it will be apparent to those skilled in the art that these implementations may be practiced without these specific details. In other instances, well-known structures and devices are shown in block diagram form or in a schematic view, rather than in detail, in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually interchangeable.

Each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "top," "bottom," "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling (e.g., any connection or coupling without additional intervening elements) may also be implemented by an indirect connection or coupling (e.g., a connection or coupling with one or more additional intervening elements, or vice versa) as long as the general purpose of the connection or coupling (e.g., to transmit a certain kind of signal or to transmit a certain kind of information) is essentially maintained. Features from different implementations may be combined to form further implementations. For example, variations or modifications described with respect to one of the implementations may also be applicable to other implementations unless noted to the contrary.

As used herein, the terms "substantially" and "approximately" mean "within reasonable tolerances of manufacturing and measurement." For example, the terms "substantially" and "approximately" may be used herein to account for small manufacturing tolerances or other factors (e.g., within 5%) that are deemed acceptable in the industry without departing from the aspects of the implementations described herein. For example, a resistor with an approximate resistance value may practically have a resistance within 5% of the approximate resistance value. As another example, a signal with an approximate signal value may practically have a signal value within 5% of the approximate signal value.

In the present disclosure, expressions including ordinal numbers, such as "first", "second", and/or the like, may modify various elements. However, such elements are not limited by such expressions. For example, such expressions do not limit the sequence and/or importance of the elements. Instead, such expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

"Sensor" may refer to a component which converts a property to be measured to an electric signal (e.g., a current signal or a voltage signal). The property to be measured may, for example, comprise a magnetic field, an electric field, an electromagnetic wave (e.g., a radio wave), a pressure, a force, a current, or a voltage, but is not limited thereto. For instance, there are various sensor techniques for measuring a current flowing through a conductor or a position of an object in connection with a magnetic field, as will be described below. For example, a system may include a current-carrying conductor that carries a current to be measured. A magnetic field sensor may detect a magnetic field created by the current and generate a sensor signal that is proportional to the magnetic field. Thus, the sensor signal may be a measure for the current.

As another example, a system may include a magnet coupled to a movable target object. The magnet may move relative to a magnetic field sensor as the moveable target object moves along a predetermined path. As the magnet moves closer to the magnetic field sensor, a magnetic field produced by the magnet may become more dense (e.g., more concentrated or stronger) in a region of the magnetic field sensor. Conversely, as the magnet moves farther from the magnetic field sensor, the magnetic field may become less dense (e.g., less concentrated or weaker) in the region of the magnetic field sensor. The magnetic field sensor may detect the magnetic field produced by the magnet and generate a sensor signal that is proportional to the magnetic field. Thus, the sensor signal may be a measure for a position of the magnet relative to the magnetic field sensor.

As another example, a diametrically magnetized magnet may rotate about a rotation axis. As the diametrically magnetized magnet rotates, a rotating magnetic field is produced at the magnetic field sensor. The magnetic field sensor may detect the rotating magnetic field produced by the rotating magnet and generate a sensor signal that is representative of the rotating magnetic field.

A sensor circuit may interpret a sensor signal and generate an output signal that can be interpreted by another device.

The magnetic field sensor and the sensor circuit may be integrated into a packaged device.

A packaged device typically has a certain number of external terminals that interface with internal circuitry of the packaged device and one or more external components. The number of external terminals may be limited in order to reduce a complexity and/or area of the packaged device. Two external terminals may be used to provide power connections to the internal circuitry. An additional external terminal may be used to provide an output signal to an external component. Thus, for a packaged device with only three external terminals, it may be difficult to provide additional information from the internal circuitry to external components, since outputting the additional information may require one or more additional external terminals. For example, if a failure occurs within the packaged device, it may be difficult to signal the failure to an external component, such as a controller. In addition, adding an additional external terminal to a packaged device may cause a change in an overall system design to accommodate the additional external terminal, which may increase overall system complexity and manufacturing costs.

Accordingly, some implementations disclosed herein are directed to packaged device, such as a semiconductor package, that is configured to provide diagnostic information to an external component without requiring an additional external terminal to be added to the packaged device. In some implementations, the packaged device may be a three-terminal packaged device. The packaged device may be a sensor package that includes an integrated circuit provided within a package casing, and a plurality of external terminals provided at the package casing and coupled to the integrated circuit. The integrated circuit may include a sensing element, such a Hall sensing element, and a sensor circuit configured to process a sensor signal from the sensing element for generating an output signal. The integrated circuit may also include a diagnostic circuit configured to evaluate one or more conditions of the integrated circuit, and generate diagnostic information based on the one or more conditions of the integrated circuit. For example, the one or more conditions may be related to one or more faults or operational states.

As a result of not adding an additional external terminal, the packaged device may be compatible with existing system designs and/or peripherals. Moreover, an ability of the packaged device to provide diagnostic information may enhance one or more safety features in a safety-critical application, such as an automotive application, in which an operational status of each component needs to be known by a control system in order to operate in a safe and reliable manner.

FIG. 1 is a diagram of an example sensor integrated circuit 100 according to one or more implementations. As shown in FIG. 1, the sensor integrated circuit 100 may include one or more sensing elements 110 (e.g., one or more magnetic field sensing elements), an analog-to-digital convertor (ADC) 120, a digital signal processor (DSP) 130, a memory element 140, and an interface 150.

The sensor integrated circuit 100 may be integrated in a semiconductor chip (e.g., a sensor chip) that includes the one or more sensing elements 110 that measure or otherwise sense one or more characteristics of a magnetic field (e.g., an amount of magnetic field flux density, a field strength, a field angle, a field direction, a field orientation, etc.) and provide a sensor signal corresponding to the sensed characteristics of the magnetic field. For example, a sensing element 110 may be configured to generate a sensor signal (e.g., a voltage) in response to one or more magnetic fields impinging on the sensing element 110. Thus, the sensor signal is indicative of a magnitude and/or a field orientation of at least one magnetic field impinging on the sensing element 110. The semiconductor chip may further include sensor circuitry for processing one or more sensor signals generated by the one or more sensing elements 110 to generate one or more output signals. In some implementations, the sensing elements 110 may be distributed on two or more semiconductor chips. The one or more semiconductor chips may be packaged in a package casing to form a packaged device.

The magnetic field may be produced by a magnet, a current-carrying conductor (e.g., a wire, a lead frame, or a busbar), the Earth, or another magnetic field source. A sensing element 110 has a "sensitivity axis" or "sensing axis." The sensing element is sensitive to a magnetic field component of a magnetic field that is projected onto or aligned with the sensitivity axis. Moreover, a sensing element 110 is substantially insensitive to magnetic field components of a magnetic field that are not projected onto or aligned with the sensitivity axis. A magnetic field component may be, for example, an x-magnetic field component Bx, a y-magnetic field component By, or a z-magnetic field component Bz. In the examples described herein, the x-magnetic field component Bx and the y-magnetic field component By are aligned in-plane to the semiconductor chip, and the z-magnetic field component Bz is aligned out-of-plane to the semiconductor chip. Accordingly, the x-magnetic field component Bx and the y-magnetic field component By may be referred to as "in-plane" magnetic field components that are aligned parallel to a chip plane (e.g., a chip surface) of the semiconductor chip. In contrast, the z-magnetic field component Bz may be referred to as an "out-of-plane" magnetic field component that extends out of the chip plane (e.g., a chip surface) of the semiconductor chip. For example, the z-magnetic field component Bz extends perpendicular to the chip plane.

In some implementations, the sensor integrated circuit 100 includes multiple sensing elements 110 that are sensitive in two or more different directions. For example, the sensor integrated circuit 100 may include a first sensing element configured to sense a first magnetic field component (e.g., the x-magnetic field component Bx), a second sensing element configured to sense a second magnetic field component (e.g., the y-magnetic field component By), and a third Hall-based sensing element configured to sense a third magnetic field component (e.g., the z-magnetic field component Bz). That is, in some implementations, the sensor integrated circuit 100 may be a 2D magnetic field sensor or a 3D magnetic field sensor that is configured to sense the magnetic field in multiple dimensions.

The sensing elements 110 may include one or more magnetoresistive-based sensing elements (i.e., magnetoresistive sensing elements) or one or more Hall-based sensing elements (i.e., Hall sensing elements). In some embodiments, the sensing elements 110 may include both one or more magnetoresistive sensing elements and one or more Hall sensing elements.

In some implementations, the sensor circuitry may be configured to combine two or more sensor signals (e.g., by addition, subtraction, or superimposition) to generate a combined sensor signal. For example, a differential sensor signal is one type of combined sensor signal that is representative of a difference between two sensor signals. In some cases, the sensor circuitry may generate the differential sensor signal from the sensor signals generated by two or more sensing elements 110 having a same sensitivity axis (e.g., two sensing elements 110 sensitive to a same magnetic field component) using differential circuitry configured to differentially combine the signals. Sensing elements electrically connected in a half-bridge configuration or in a full-bridge configuration (e.g., a Wheatstone bridge) are examples of differential circuitry that may be used to generate differential sensor signals. Additionally, or alternatively, differential circuitry may include a differential amplifier, an adder, a subtractor, a combiner, logic circuitry, and/or a processor (e.g., a processor that applies differential calculus) to differentially combine the signals to generate a differential sensor signal. Thus, differential sensor signal may by a measurement signal that provides a robustness to homogeneous external stray magnetic fields.

The above-described examples of sensing elements 110 are provided for illustrative purposes and, in practice, the sensing elements 110 may include any type of magnetic field sensing element capable of sensing a characteristic of a magnetic field and enabling a sensor signal to be provided to sensor circuitry.

The ADC 120 may include an analog-to-digital converter that converts an analog signal from one or more sensing elements 110 to a digital signal. For example, the ADC 120 may convert analog signals, received from the set of sensing elements 110, into digital signals (e.g., digital samples) to be processed by DSP 130. The ADC 120 may provide the digital signals to DSP 130. In some implementations, the sensor integrated circuit 100 may include one or more ADCs 120. For example, different ADCs 120 may be configured to receive analog signals from different sets of sensing elements 110.

The DSP 130 may include a digital signal processing device or a collection of digital signal processing devices. In some implementations, the DSP 130 may receive digital signals from the ADC 120 and may process the digital signals to generate output information and to form output signals (e.g., destined for a controller), such as an output signal that conveys sensor data, as described elsewhere herein. Thus, the DSP 130 may generate the output information based on one or more digital signals derived from one or more sensor signals.

The memory element 140 may include a read-only memory (ROM) (e.g., an EEPROM), a random-access memory (RAM), and/or another type of dynamic or static storage device (e.g., a flash memory, a magnetic memory, an optical memory, etc.) that stores information and/or instructions for use by the sensor integrated circuit 100. In some implementations, the memory element 140 may store information associated with processing performed by DSP 130. Additionally, or alternatively, the memory element 140 may store configurational values or parameters for the one or more sensing elements 110 and/or information for one or more other components of the sensor integrated circuit 100, such as the ADC 120 or the interface 150.

The interface 150 may include an interface via which the sensor integrated circuit 100 may receive and/or provide information from and/or to another device in a system, such as a controller. For example, the interface 150 may provide the output signal, determined or otherwise generated by DSP 130, to the controller, and may further receive information from the controller. In some implementations, the interface 150 may be a communication interface that receives the output signals from the DSP 130 and provides the output signals as communication signals according to a communication protocol, which may include transmitting the output signals as the communication signals or generating the communication signals based on the output signals. The DSP 130 or the interface 150 may include a protocol generator that generates the output signal according to a signal protocol that conveys the sensor data in a format that can be interpreted by another device, such as the controller. The signal protocol may include generating an output signal at different signal levels and/or with one or more modulation patterns to convey different information.

As indicated above, FIG. 1 is provided as an example. Other examples may differ from what is described with regard to FIG. 1. The number and arrangement of components shown in FIG. 1 are provided as an example. In practice, the sensor integrated circuit may include additional components, fewer components, different components, or differently arranged components than those shown in FIG. 1. Two or more components shown in FIG. 1 may be implemented within a single component, or a single component shown in FIG. 1 may be implemented as multiple, distributed components. Additionally, or alternatively, a set of components (e.g., one or more components) of the sensor integrated circuit may perform one or more functions described as being performed by another set of components of the sensor integrated circuit.

Figure 2:
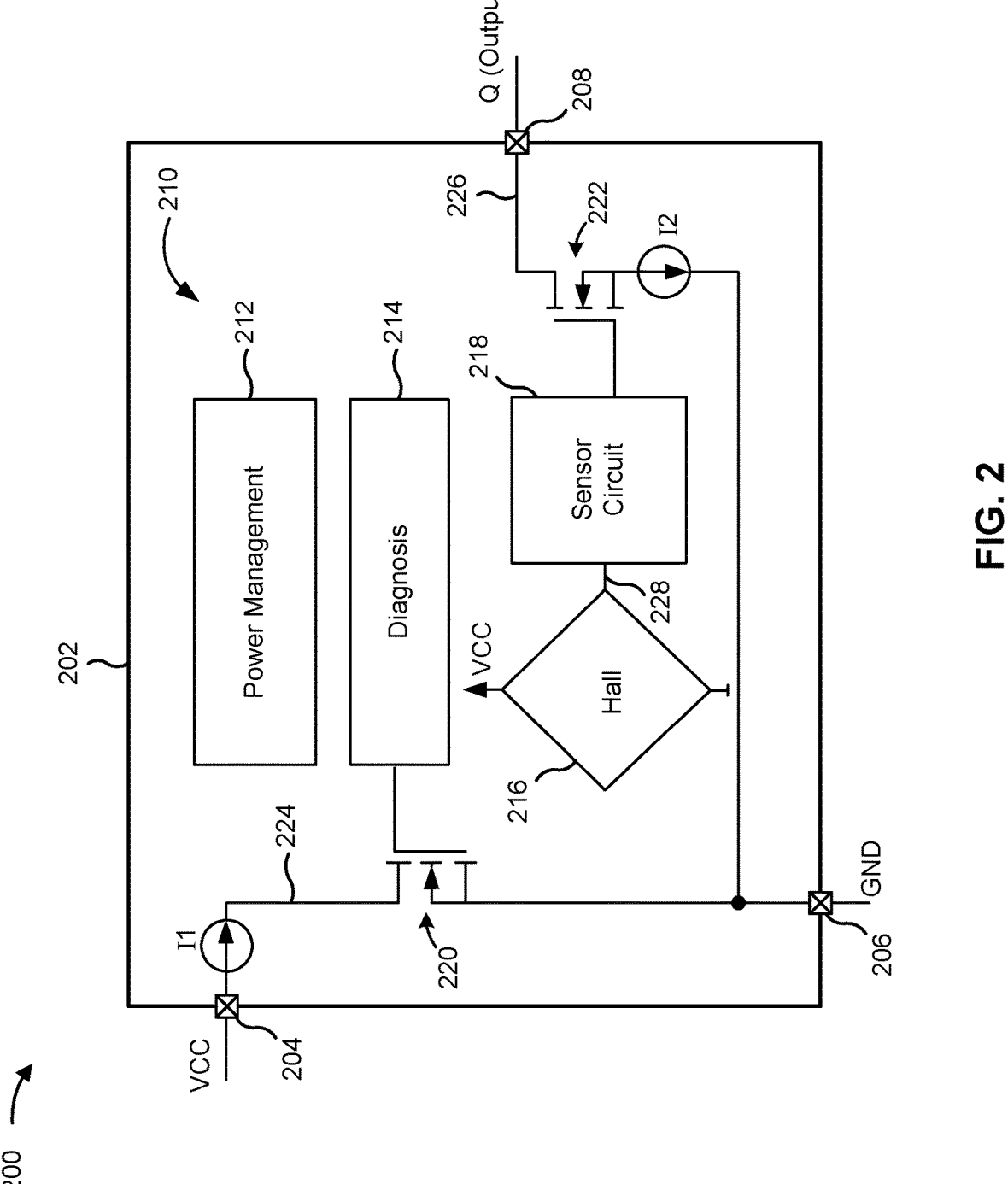
FIG. 2 shows a packaged device according to one or more implementations.

FIG. 2 shows a packaged device 200 according to one or more implementations. The packaged device 200 may have a predetermined number of external terminals. For example, the packaged device 200 be a three-terminal packaged device that only has three external terminals. In some implementations, the packaged device 200 may be a sensor package that includes one or more sensing elements and a sensor circuit.

The packaged device 200 may include a package casing 202, a first supply terminal 204 arranged at the package casing 202 and configured to be coupled to a first supply potential (e.g., VCC), a second supply terminal 206 arranged at the package casing 202 and configured to be coupled to a second supply potential (e.g., ground (GND)), and an output terminal 208 arranged at the package casing 202 and configured to provide an output signal Q modulated based on output information. The packaged device 200 may also include an integrated circuit 210 that is encapsulated by the package casing 202. In other words, the integrated circuit 210 is integrated within the packaged device 200. The integrated circuit 210 may be integrated on one or more chips or dies. The integrated circuit 210 may be coupled to the first supply terminal 204, the second supply terminal 206, and the output terminal 208.

The integrated circuit 210 may include a power management circuit 212 (e.g., a power management IC) and a diagnostic circuit 214 (e.g., a diagnostic IC). In cases where the packaged device 200 is a sensor package, the integrated circuit 210 may include a sensing element 216 and a sensor circuit 218. In addition, the integrated circuit 210 may include a first current modulator component 220 and a second current modulator component 222.

The integrated circuit 210 may include a first current path 224 coupled between the first supply terminal 204 and the second supply terminal 206. The first current path 224 may enable a first current I1 to flow along the first current path 224 from the first supply terminal 204 to the second supply terminal 206. The first current modulator component 220 may be arranged in the first current path 224. Thus, the first current modulator component 220 may modulate the first current I1 flowing along the first current path 224. For example, the first current modulator component 220 may be a first transistor that includes a control terminal (e.g., a gate terminal) and two current path terminals that are configured to be coupled by a conduction channel based on a control signal applied to the control terminal. By modulating the first current I1 flowing along the first current path 224, the first current modulator component 220 may modulate a voltage at the first supply terminal 204 or a voltage at the second supply terminal 206. For example, the voltage at the first supply terminal 204 or the voltage at the second supply terminal 206 may be modulated to provide an additional information signal without requiring an additional terminal to be added at the package casing 202.

Additionally, the integrated circuit 210 may include a second current path 226 coupled between the output terminal 208 and the second supply terminal 206. The second current path 226 may enable a second current I2 to flow along the second current path 226 from the output terminal 208 to the second supply terminal 206. The second current modulator component 222 may be arranged in the second current path 226. The second current modulator component 222 may modulate the second current I2 flowing along the second current path 226. For example, the second current modulator component 222 may be a second transistor that includes a control terminal (e.g., a gate terminal) and two current path terminals that are configured to be coupled by a conduction channel based on a control signal applied to the control terminal.

By modulating the second current I2 flowing along the second current path 226, the second current modulator component 222 may modulate a voltage at the output terminal 208. For example, the output terminal 208 may be coupled to a power supply that provides a third supply potential. The output terminal 208 may be coupled indirectly to the power supply by a pull-up resistor. Thus, the second current I2 may flow from the power supply, through the pull-up resistor, and into the packaged device 200 via the output terminal 208. The second current I2 may flow along the second current path 226 to ground. Additionally, the second current I2 may be controlled by the second current modulator component 222. As a result of the second current I2 flowing through the pull-up resistor, a voltage may be produced at the output terminal 208 based on a voltage drop across the pull-up resistor produced by the second current I2. An amplitude of the voltage at the output terminal 208 may depend on an amplitude of the second current I2, which may be modulated by the second current modulator component 222. Thus, the output signal Q may be a voltage that is modulated based on a modulation of the second current I2.

As will be described in further detail below, a modulation of the first current I1 may be decoupled from a modulation of the second current I2. In other words, the modulation of the first current I1 and the modulation of the second current I2 may be performed independently of each other to generate two separate information signals that can be provided to and interpreted by an external component, such as a controller. Thus, the modulation of the first current I1 may be independent of a modulation of the output signal Q.

The power management circuit 212 may be coupled to the first supply potential and the second supply potential, and may manage a power distribution within the integrated circuit 210. For example, the power management circuit 212 may provide the first supply potential and the second supply potential to components of the diagnostic circuit 214, to supply terminals of the sensing element 216, and to components of the sensor circuit 218 to enable an operation of each component. Thus, the sensing element 216 may be biased by the first supply potential and the second supply potential that are present at the first supply terminal 204 and the second supply terminal 206, respectively, or by voltages derived from the first supply potential and the second supply potential.

The sensing element 216 may be configured to generate a sensor signal 228 based on a sensed property. For example, the sensing element may be a Hall sensing element, and the sensed property may be an external magnetic field. In some implementations, the external magnetic field may be a rotating magnetic field that is coupled to a rotor of a motor or to another rotating object.

The sensor circuit 218 may be configured to receive the sensor signal 228, derive output information from the sensor signal 228, and modulate the output signal Q based on the output information. For example, the sensor circuit 218 may include an ADC (e.g., ADC 120) and a DSP (e.g., DSP 130), as similarly described in connection with FIG. 1. Thus, the sensor circuit 218 may include a processing circuit that is configured to process the sensor signal 228 to determine the output information. The processing circuit may include a protocol generator that may determine, according to a signal protocol, in what manner to modulate the output signal Q to convey the output information, and generate a control signal for controlling the second current modulator component 222 in order to modulate the second current I2 and the output signal Q. In some implementations, the protocol generator may, based on the sensor signal 228, control a conduction channel of the second current modulator component 222 to modulate the second current I2 flowing along the second current path 226.

The diagnostic circuit 214 may evaluate one or more fault conditions of the integrated circuit 210, generate diagnostic information based on the one or more fault conditions of the integrated circuit 210, and control the first current modulator component 220 such that the first current I1 is modulated based on the diagnostic information. For example, the diagnostic circuit 214 may evaluate a condition of the sensing element 216, including whether the sensing element 216 is in a faulty state, and generate the diagnostic information based on the condition of the sensing element 216. The diagnostic circuit 214 may include driver circuitry or control circuitry that controls the first current modulator component 220. For example, the diagnostic circuit 214 may, based on the diagnostic information, control a conduction channel of the transistor to modulate the first current I1 flowing along the first current path 224.

In some implementations, the diagnostic circuit 214 may set the first current modulator component 220 in a first current consumption state based on the sensing element 216 not being in a faulty state, and the diagnostic circuit 214 may set the first current modulator component 220 in a second current consumption state based on the sensing element 216 being in the faulty state. The first current consumption state and the second current consumption state may correspond to different current consumptions. Different current consumptions at the first current modulator component 220 may produce different current amplitudes. Thus, the diagnostic circuit 214 may modulate a current consumption state of the first current modulator component 220 to modulate the first current I1.

In some implementations, the diagnostic circuit 214 may control the first current modulator component 220 to modulate the first current I1 with a first modulation pattern based on the sensing element 216 not being in a faulty state, and the diagnostic circuit 214 may control the first current modulator component 220 to modulate the first current I1 with a second modulation pattern based on the sensing element 216 being in the faulty state. The first modulation pattern and the second modulation pattern may be different modulation patterns. For example, the different modulation patterns may be different pulse-width modulation (PWM) patterns. Alternatively, the different modulation patterns may include a PWM pattern and a steady-state pattern (e.g., a pattern with a constant signal level). Alternatively, the different modulation patterns may include different steady-state patterns. Thus, the different modulation patterns may include different signal patterns of any kind or combination. Modulating the first current I1 with different modulation patterns may include switching the first current modulator component 220 on and off, or switching the first current modulator component 220 between two or more current consumption states. In addition, two or more conditions of the integrated circuit 210 may be monitored, and a state of each condition may be encoded onto the first current I1 by modulating the first current I1 using one or more current modulation techniques. For example, three or more modulation patterns may be used to communicate the diagnostic information of two or more conditions.

As indicated above, FIG. 2 is provided as an example. Other examples may differ from what is described with regard to FIG. 2. In practice, the packaged device 200 may include additional components, fewer components, different components, or differently arranged components than those shown in FIG. 2.

Figure 3A:
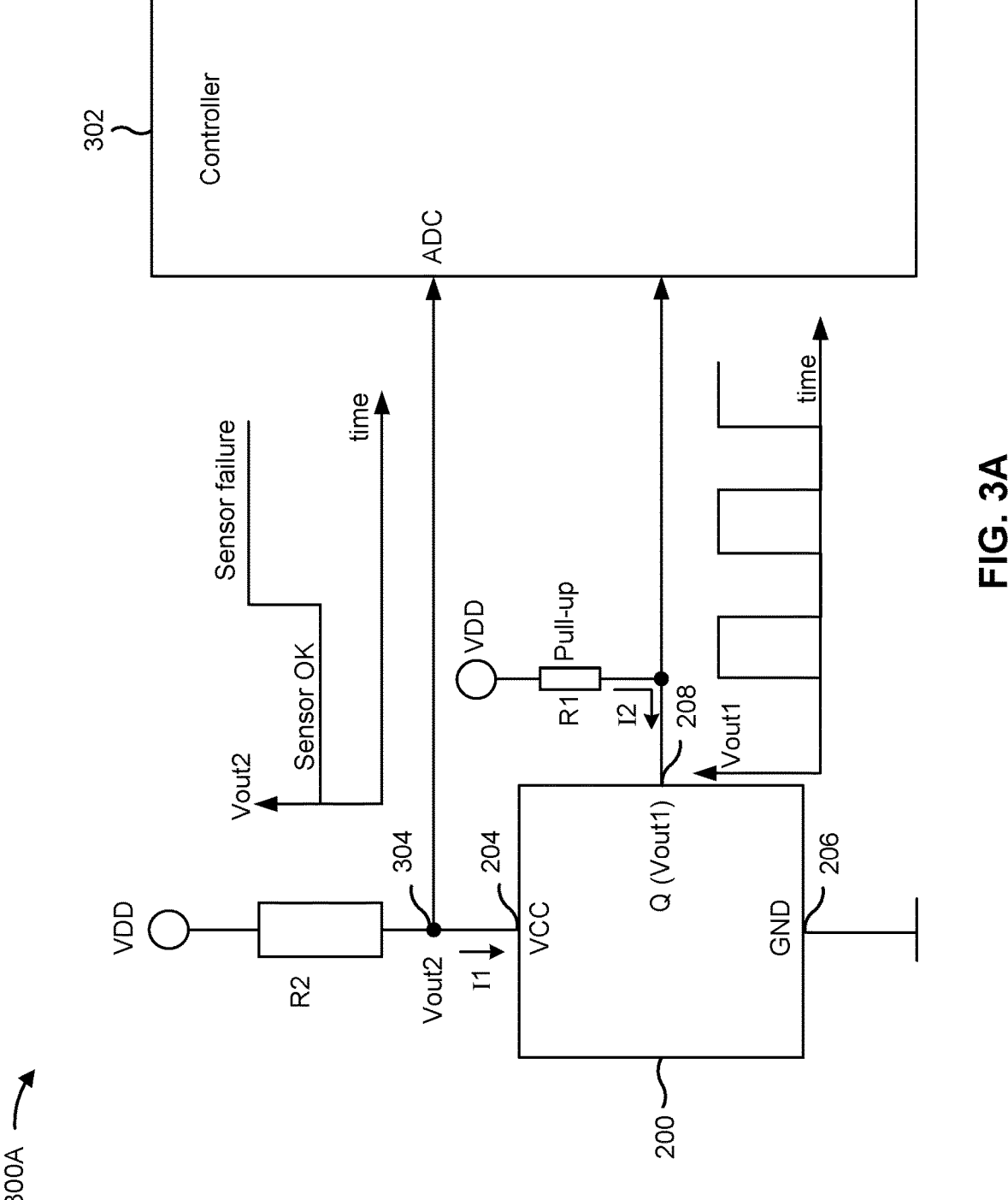
FIG. 3A shows a system according to one or more implementations.

FIG. 3A shows a system 300A according to one or more implementations. In some implementations, the system 300A may be a sensor system configured to communicate sensor data. The system 300A may include the packaged device 200, as described in connection with FIG. 2. In addition, the system 300A may include a controller 302 (e.g., an external controller) configured to receive information from the packaged device 200.

The system 300A may include a pull-up resistor R1 that is coupled between a power supply VDD and the output terminal 208 of the packaged device 200. The packaged device 200 may be configured to sink the second current I2 into the second current path 226 based on a control scheme of the second current modulator component 222. Thus, the output terminal 208 may be coupled indirectly to the power supply VDD (e.g., a third supply potential) by the pull-up resistor R1.

The second current I2 may flow from the power supply VDD, through the pull-up resistor R1, and into the packaged device 200 via the output terminal 208. The second current I2 may flow along the second current path 226 to ground. Additionally, the second current I2 may be modulated by the second current modulator component 222. Based on the second current I2 flowing through the pull-up resistor R1, a voltage Vout1 may be produced at the output terminal 208 based on a voltage drop across the pull-up resistor R1 that is produced by the second current I2. An amplitude of the voltage Vout1 at the output terminal 208 may depend on an amplitude of the second current I22. Thus, the output signal Q may be the voltage Vout1 that has an amplitude that is modulated based on the modulation of the second current I2.

The voltage Vout1 may be modulated to provide output information to the controller 302. The controller 302 may decode a modulation of the voltage Vout1 to obtain the output information. For example, the voltage Vout1 may be a PWM signal having one or more characteristics corresponding to the output information. For example, a frequency, a pulse width, a pulse pattern, and/or an amplitude of the voltage Vout1 may be regulated by the processing circuit of the packaged device 200 (e.g., the sensor circuit 218) to convey output information to the controller 302. In some implementations, the output information may be based on the sensor signal 228, and the output information may be sensor information corresponding to a sensed property, such as an external magnetic field.

The system 300A may include a sense node 304 coupled to the controller 302 and the first supply terminal 204 of the packaged device 200. The system 300A may also include a sense resistor R2 coupled between the first supply terminal 204 and a power supply VDD (e.g., a positive supply potential of a power supply) configured to provide the first supply potential. In other words, the sense resistor R2 may be coupled between the sense node 304 and the power supply VDD. The sense resistor R2 may be configured to conduct the first current I1 to generate a voltage Vout2 at the sense node 304. For example, the voltage Vout2 may be based on a voltage drop across the sensor resistor R2 that depends on the first current I1. The first current modulator component 220 may be configured to modulate the voltage Vout2 by modulating the first current I1 flowing along the first current path 224.

The controller 302 may be coupled to the sense node 304 to receive the voltage Vout2. The controller 302 may decode a modulation of the voltage Vout2 to obtain the diagnostic information. For example, the controller 302 may include an ADC configured to sample the voltage Vout2. Additionally, the controller 302 may include processing circuitry that may process and decode digital samples of the voltage Vout2. In some implementations, the diagnostic circuit 214 may set the voltage Vout2 to a first voltage level by setting a current consumption state of the first current modulator component 220 to the first current consumption state to indicate that the sensing element 216 is not in a faulty state (e.g., sensor OK). The diagnostic circuit 214 may set the voltage Vout2 to a second voltage level by setting the current consumption state of the first current modulator component 220 to the second current consumption state to indicate that the sensing element 216 is in a faulty state (e.g., sensor failure).

As indicated above, FIG. 3A is provided as an example. Other examples may differ from what is described with regard to FIG. 3A. In practice, the system 300A may include additional components, fewer components, different components, or differently arranged components than those shown in FIG. 3A.

Figure 3B:
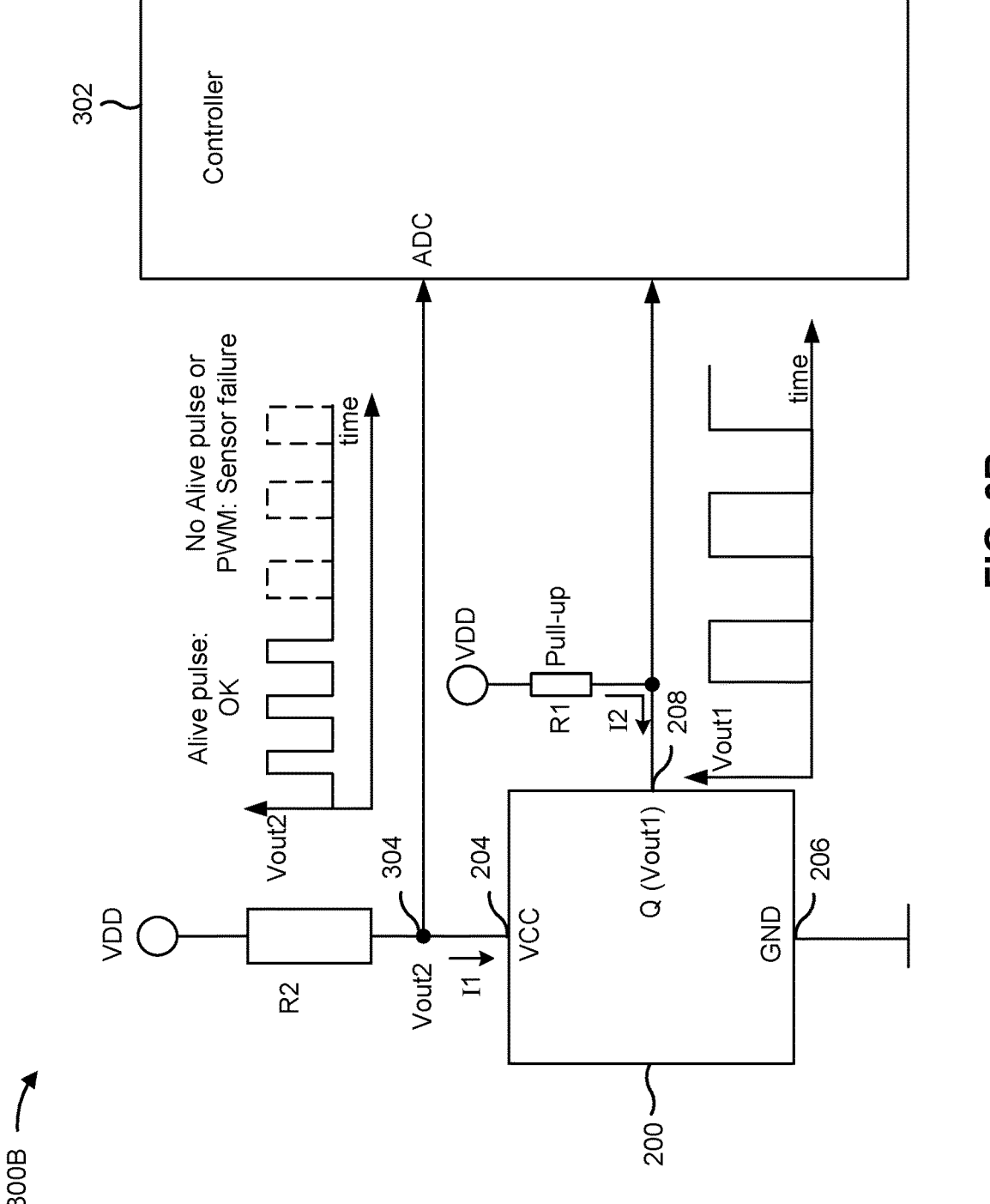
FIG. 3B shows a system according to one or more implementations.

FIG. 3B shows a system 300B according to one or more implementations. The system 300B may be similar to the system 300A described in connection with FIG. 3A, with the exception that two alternative modulation patterns are generated at the sense node 304 to signal the diagnostic information. For example, the diagnostic circuit 214 may control the first current modulator component 220 to modulate the first current I1 with a pulsed-pattern to indicate that the sensing element 216 is not in a faulty state (e.g., sensor OK). As a result of the first current I1 having a pulsed-pattern, the voltage Vout2 also has a pulsed-pattern. Additionally, the diagnostic circuit 214 may control the first current modulator component 220 to set the first current I1 in a steady-state (e.g., no pulses) to indicate that the sensing element 216 is in a faulty state (e.g., sensor failure). As a result of the first current I1 being in a steady-state, the voltage Vout2 is also in a steady-state.

As indicated above, FIG. 3B is provided as an example. Other examples may differ from what is described with regard to FIG. 3B. For example, other current consumption states and/or modulation patterns are possible.

Figure 4A:
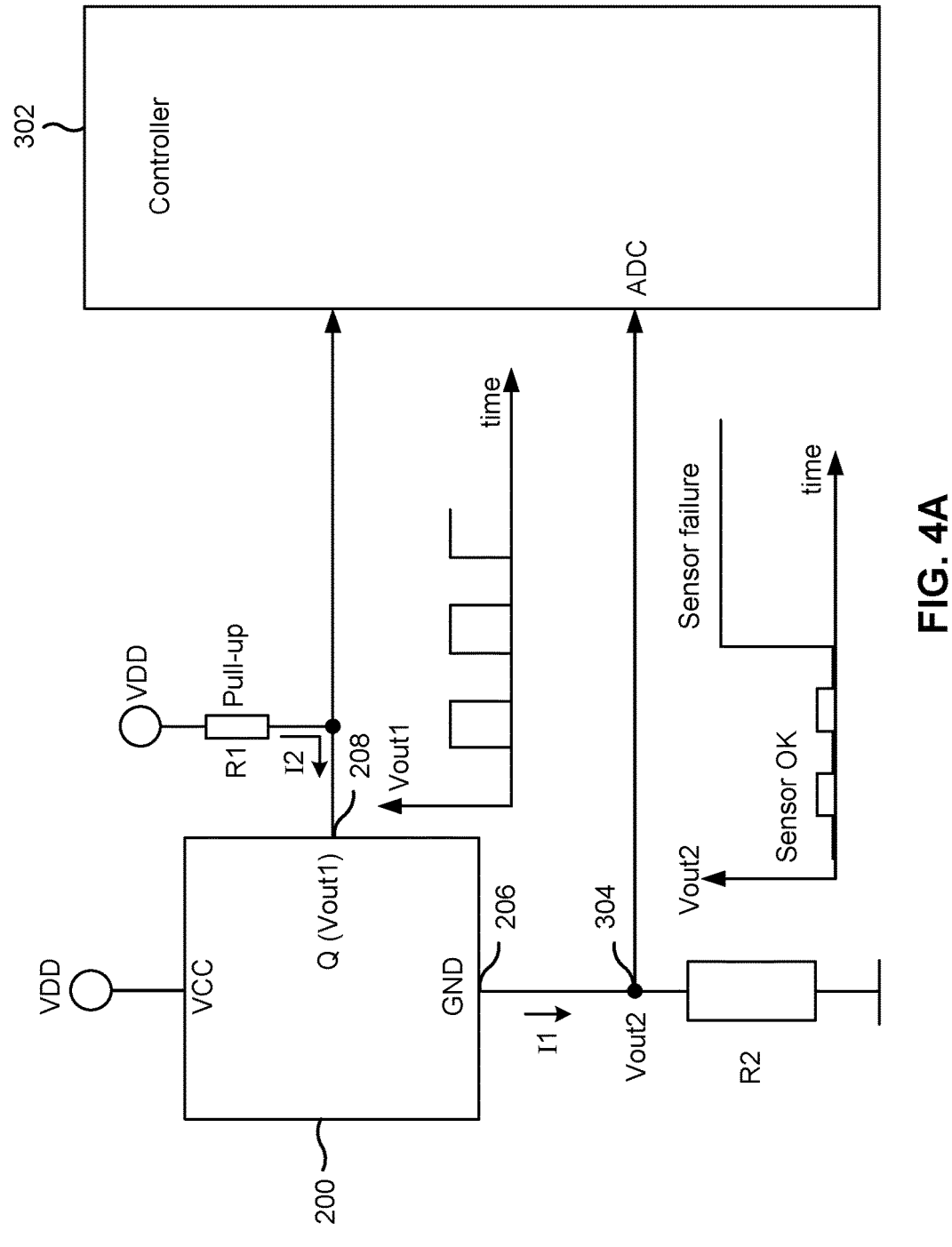
FIG. 4A shows a system according to one or more implementations.

FIG. 4A shows a system 400A according to one or more implementations. The system 400A may be similar to the system 300A described in connection with FIG. 3A, with the exception that the sense node 304 is coupled to the controller 302 and the second supply terminal 206, and the sense resistor R2 is coupled between a power supply (e.g., a ground supply potential GND of a power supply). In other words, the sense resistor R2 may be coupled between the sense node 304 and the power supply. The sense resistor R2 may be configured to conduct the first current I1 to generate the voltage Vout2 at the sense node 304. For example, the voltage Vout2 may be based on the voltage drop across the sensor resistor R2 that depends on the first current I1. The first current modulator component 220 may be configured to modulate the voltage Vout2 by modulating the first current I1 flowing along the first current path 224. For example, the diagnostic circuit 214 may control the first current modulator component 220 to produce a first modulation pattern at the sense node 304 to indicate that the sensing element 216 is not in a faulty state (e.g., sensor OK), and may control the first current modulator component 220 to produce a second modulation pattern at the sense node 304 to indicate that the sensing element 216 is in a faulty state (e.g., sensor failure). The controller 302 may decode the modulation of the voltage Vout2 to obtain the diagnostic information.

As indicated above, FIG. 4A is provided as an example. Other examples may differ from what is described with regard to FIG. 4A.

Figure 4B:
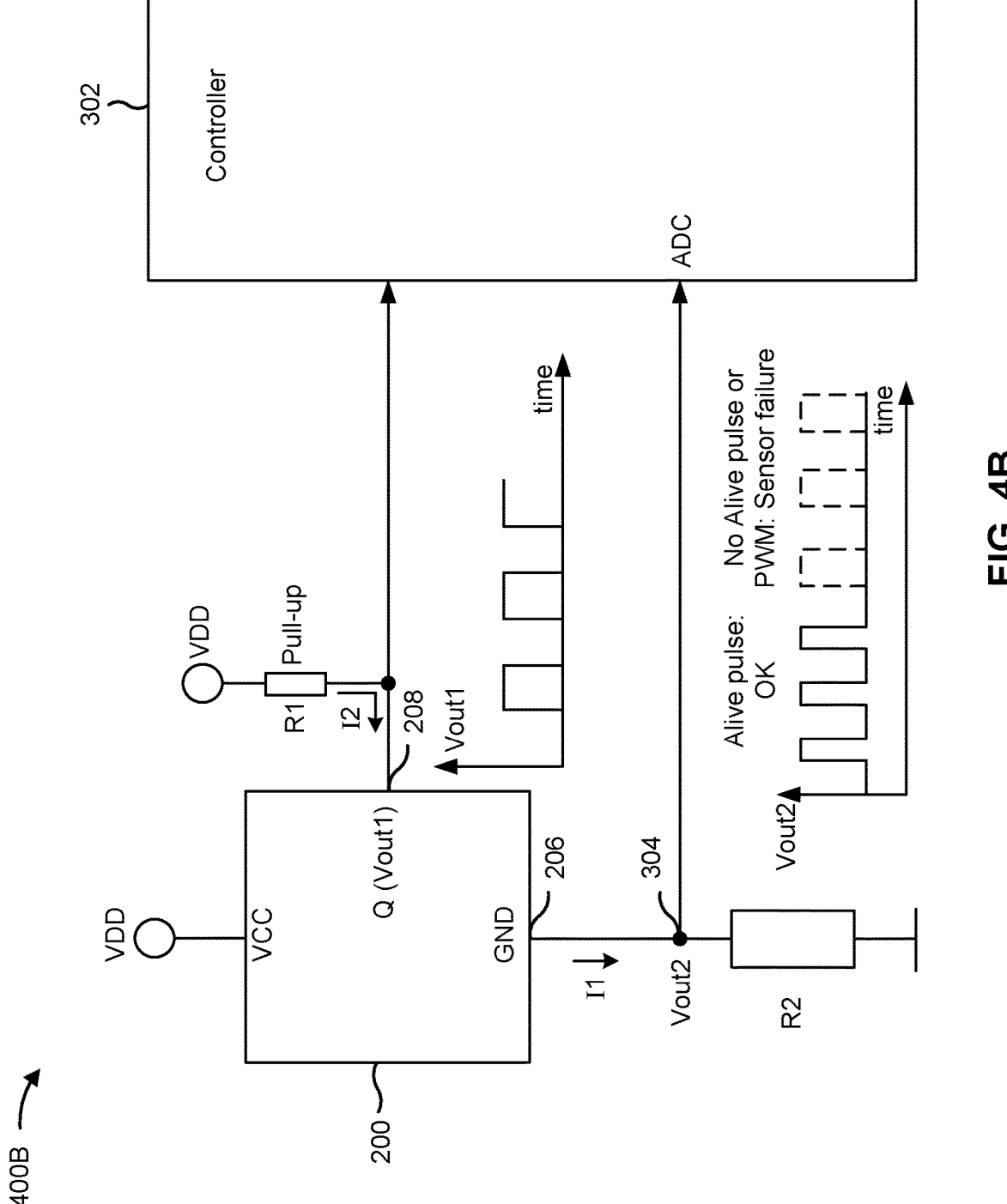
FIG. 4B shows a system according to one or more implementations.

FIG. 4B shows a system 400B according to one or more implementations. The system 400B may be similar to the system 400A described in connection with FIG. 4A, with the exception that two alternative modulation patterns are generated at the sense node 304 to signal the diagnostic information. For example, the diagnostic circuit 214 may control the first current modulator component 220 to modulate the first current I1 with a pulsed-pattern to indicate that the sensing element 216 is not in a faulty state (e.g., sensor OK). As a result of the first current I1 having a pulsed-pattern, the voltage Vout2 also has a pulsed-pattern. Additionally, the diagnostic circuit 214 may control the first current modulator component 220 to set the first current I1 in a steady-state (e.g., no pulses) to indicate that the sensing element 216 is in a faulty state (e.g., sensor failure). As a result of the first current I1 being in a steady-state, the voltage Vout2 is also in a steady-state.

As indicated above, FIG. 4B is provided as an example. Other examples may differ from what is described with regard to FIG. 4B. For example, other current consumption states and/or modulation patterns are possible.

The following provides an overview of some Aspects of the present disclosure:

Aspect 1: A sensor system, comprising: a sensor package comprising an integrated circuit and a plurality of external terminals coupled to the integrated circuit, wherein the plurality of external terminals include a first supply terminal configured to be coupled to a first supply potential, a second supply terminal configured to be coupled to a second supply potential, and an output terminal configured to provide an output signal modulated based on a sensor signal, wherein the integrated circuit comprises: a sensing element configured to generate the sensor signal based on a sensed property; a sensor circuit configured to receive the sensor signal and modulate the output signal based on the sensor signal; a first current path coupled between the first supply terminal and the second supply terminal, wherein the first current path is configured to enable a first current to flow along the first current path from the first supply terminal to the second supply terminal; a first current modulator component arranged in the first current path, wherein the first current modulator component is configured to modulate the first current flowing along the first current path; and a diagnostic circuit configured to evaluate one or more conditions of the integrated circuit, generate diagnostic information based on the one or more conditions of the integrated circuit, and control the first current modulator component such that the first current is modulated based on the diagnostic information.

Aspect 2: The sensor system of Aspect 1, wherein the sensing element is a Hall sensing element, and the sensed property is an external magnetic field.

Aspect 3: The sensor system of any of Aspects 1-2, wherein the first current modulator component is a transistor, and wherein the diagnostic circuit is configured to, based on the diagnostic information, control a conduction channel of the transistor to modulate the first current flowing along the first current path.

Aspect 4: The sensor system of any of Aspects 1-3, wherein the diagnostic circuit is configured to evaluate a condition of the sensing element, including whether the sensing element is in a faulty state, and generate the diagnostic information based on the condition of the sensing element.

Aspect 5: The sensor system of Aspect 4, wherein the diagnostic circuit is configured to set the first current modulator component in a first current consumption state based on the sensing element not being in a faulty state, and wherein the diagnostic circuit is configured to set the first current modulator component in a second current consumption state based on the sensing element being in the faulty state, wherein the first current consumption state and the second current consumption state correspond to different current consumptions.

Aspect 6: The sensor system of Aspect 4, wherein the diagnostic circuit is configured to control the first current modulator component to modulate the first current with a first modulation pattern based on the sensing element not being in a faulty state, and wherein the diagnostic circuit is configured to control the first current modulator component to modulate the first current with a second modulation pattern based on the sensing element being in the faulty state, wherein the first modulation pattern and the second modulation pattern are different modulation patterns.

Aspect 7: The sensor system of any of Aspects 1-6, wherein the plurality of external terminals consist of the first supply terminal, the second supply terminal, and the output terminal.

Aspect 8: The sensor system of any of Aspects 1-7, wherein the sensor circuit includes: a second current path coupled between the output terminal and the second supply terminal, wherein the second current path is configured to enable a second current to flow along the second current path from the output terminal to the second supply terminal; a second current modulator component arranged in the second current path, wherein the second current modulator component is configured to modulate the second current flowing along the second current path; and a protocol generator configured to receive the sensor signal and control the second current modulator component such that the second current is modulated based on the sensor signal.

Aspect 9: The sensor system of Aspect 8, wherein the second current modulator component is a transistor, and wherein the protocol generator is configured to, based on the sensor signal, control a conduction channel of the transistor to modulate the second current flowing along the second current path.

Aspect 10: The sensor system of Aspect 8, wherein a modulation of the first current is decoupled from a modulation of the second current.

Aspect 11: The sensor system of Aspect 8, wherein the output signal is a voltage that is modulated based on a modulation of the second current.

Aspect 12: The sensor system of Aspect 8, wherein the output terminal is configured to be coupled, indirectly, to a third supply potential.

Aspect 13: The sensor system of any of Aspects 1-12, wherein the sensing element is configured to be biased by the first supply potential and the second supply potential.

Aspect 14: The sensor system of any of Aspects 1-13, wherein a modulation of the first current is independent of a modulation of the output signal.

Aspect 15: The sensor system of any of Aspects 1-14, further comprising: a controller; a sense node coupled to the controller and the first supply terminal; and a resistor coupled between the first supply terminal and a power supply configured to provide the first supply potential, wherein the resistor is configured to conduct the first current to generate a voltage at the sense node, wherein the first current modulator component is configured to modulate the voltage by modulating the first current flowing along the first current path.

Aspect 16: The sensor system of Aspect 15, wherein the controller is configured to decode a modulation of the voltage to obtain the diagnostic information.

Aspect 17: The sensor system of any of Aspects 1-16, further comprising: a controller; a sense node coupled to the controller and the second supply terminal; and a resistor coupled between the second supply terminal and a power supply configured to provide the second supply potential, wherein the resistor is configured to conduct the first current to generate a voltage at the sense node, wherein the first current modulator component is configured to modulate the voltage by modulating the first current flowing along the first current path.

Aspect 18: The sensor system of Aspect 17, wherein the controller is configured to decode a modulation of the voltage to obtain the diagnostic information.

Aspect 19: The sensor system of any of Aspects 1-18, wherein the first current modulator component is configured to modulate a voltage at the first supply terminal or at the second supply terminal by modulating the first current flowing along the first current path.

Aspect 20: A three-terminal packaged device, comprising: a package casing; a first supply terminal arranged at the package casing and configured to be coupled to a first supply potential; a second supply terminal arranged at the package casing and configured to be coupled to a second supply potential; an output terminal arranged at the package casing and configured to provide an output signal modulated based on output information; and an integrated circuit that is encapsulated by the package casing, wherein the integrated circuit is coupled to the first supply terminal, the second supply terminal, and the output terminal, and wherein the integrated circuit comprises: a processing circuit configured to generate the output information; a current path coupled between the first supply terminal and the second supply terminal, wherein the current path is configured to enable a current to flow along the current path from the first supply terminal to the second supply terminal; a current modulator component arranged in the current path, wherein the current modulator component is configured to modulate a voltage at the first supply terminal or at the second supply terminal by modulating the current flowing along the current path; and a diagnostic circuit configured to evaluate one or more fault conditions of the integrated circuit, generate diagnostic information based on the one or more fault conditions of the integrated circuit, and control the current modulator component such that the current is modulated based on the diagnostic information.

Aspect 21: A method of providing diagnostic information from a three-terminal packaged device, the method comprising: providing a first supply potential to a first supply terminal of the three-terminal packaged device; providing a second supply potential to a second supply terminal of the three-terminal packaged device; generating a sensor signal based on a sensed property; generating an output signal at an output terminal based on the sensor signal; evaluating a diagnostic condition of the three-terminal packaged device; and modulating a voltage at the first supply terminal or at the second supply terminal by modulating a current flowing between the first supply terminal and the second supply terminal, wherein the current is modulated based on a status of the diagnostic condition.

Aspect 22: A system configured to perform one or more operations recited in one or more of Aspects 1-21.

Aspect 23: An apparatus comprising means for performing one or more operations recited in one or more of Aspects 1-21.

Aspect 24: A non-transitory computer-readable medium storing a set of instructions, the set of instructions comprising one or more instructions that, when executed by a device, cause the device to perform one or more operations recited in one or more of Aspects 1-21.

Aspect 25: A computer program product comprising instructions or code for executing one or more operations recited in one or more of Aspects 1-21.

The foregoing disclosure provides illustration and description, but is not intended to be exhaustive or to limit the implementations to the precise form disclosed. Modifications and variations may be made in light of the above disclosure or may be acquired from practice of the implementations.

Some implementations may be described herein in connection with thresholds. As used herein, "satisfying" a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

As used herein, the term "component" is intended to be broadly construed as hardware, firmware, or a combination of hardware and software. Systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Any of the processing components may be implemented as a central processing unit (CPU) or other processor reading and executing a software program from a non-transitory computer-readable recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPLAs), programmable logic controller (PLC), or other equivalent integrated or discrete logic circuitry. Accordingly, the term "processor," as used herein, refers to any of the foregoing structures or any other structure suitable for implementation of the techniques described herein. Software may be stored on a non-transitory computer-readable medium such that the non-transitory computer readable medium includes program code or a program algorithm stored thereon that, when executed, causes the processor, via a computer program, to perform the steps of a method.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (e.g., measurement signals) from one or more components in the form of raw measurement data and may derive, from the measurement signal, further information. "Signal conditioning," as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation, and any other processes required to make a signal suitable for processing after conditioning.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a and b, a and c, b and c, and a, b, and c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A sensor system, comprising:
   a sensor package comprising an integrated circuit and a plurality of external terminals coupled to the integrated circuit,
   wherein the plurality of external terminals include a first supply terminal configured to be coupled to a first supply potential, a second supply terminal configured to be coupled to a second supply potential, and an output terminal configured to provide an output signal modulated based on a sensor signal,
   wherein the integrated circuit comprises:
   a sensing element configured to generate the sensor signal based on a sensed property;
   a sensor circuit configured to receive the sensor signal and modulate the output signal based on the sensor signal;
   a first current path coupled between the first supply terminal and the second supply terminal, wherein the first current path is configured to enable a first current to flow along the first current path from the first supply terminal to the second supply terminal;
   a first current modulator component arranged in the first current path, wherein the first current modulator component is configured to modulate the first current flowing along the first current path; and
   a diagnostic circuit configured to evaluate one or more conditions of the integrated circuit, generate diagnostic information based on the one or more conditions of the integrated circuit, and control the first current modulator component such that the first current is modulated based on the diagnostic information,
   wherein the diagnostic circuit is configured to evaluate a condition of the sensing element, including whether the sensing element is in a faulty state, and generate the diagnostic information based on the condition of the sensing element.

2. The sensor system of claim 1, wherein the sensing element is a Hall sensing element, and the sensed property is an external magnetic field.

3. The sensor system of claim 1, wherein the first current modulator component is a transistor, and wherein the diagnostic circuit is configured to, based on the diagnostic information, control a conduction channel of the transistor to modulate the first current flowing along the first current path.

4. The sensor system of claim 1, wherein the diagnostic circuit is configured to set the first current modulator component in a first current consumption state based on the sensing element not being in a faulty state, and wherein the diagnostic circuit is configured to set the first current modulator component in a second current consumption state based on the sensing element being in the faulty state, wherein the first current consumption state and the second current consumption state correspond to different current consumptions.

5. The sensor system of claim 1, wherein the diagnostic circuit is configured to control the first current modulator component to modulate the first current with a first modulation pattern based on the sensing element not being in a faulty state, and wherein the diagnostic circuit is configured to control the first current modulator component to modulate the first current with a second modulation pattern based on the sensing element being in the faulty state, wherein the first modulation pattern and the second modulation pattern are different modulation patterns.

6. The sensor system of claim 1, wherein the plurality of external terminals consist of the first supply terminal, the second supply terminal, and the output terminal.

7. The sensor system of claim 1, wherein the sensor circuit includes:

a second current path coupled between the output terminal and the second supply terminal, wherein the second current path is configured to enable a second current to flow along the second current path from the output terminal to the second supply terminal;

a second current modulator component arranged in the second current path, wherein the second current modulator component is configured to modulate the second current flowing along the second current path; and a protocol generator configured to receive the sensor signal and control the second current modulator component such that the second current is modulated based on the sensor signal.

8. The sensor system of claim 7, wherein the second current modulator component is a transistor, and wherein the protocol generator is configured to, based on the sensor signal, control a conduction channel of the transistor to modulate the second current flowing along the second current path.

9. The sensor system of claim 7, wherein a modulation of the first current is decoupled from a modulation of the second current.

10. The sensor system of claim 7, wherein the output signal is a voltage that is modulated based on a modulation of the second current.

11. The sensor system of claim 7, wherein the output terminal is configured to be coupled, indirectly, to a third supply potential.

12. The sensor system of claim 1, wherein the sensing element is configured to be biased by the first supply potential and the second supply potential.

13. The sensor system of claim 1, wherein a modulation of the first current is independent of a modulation of the output signal.

14. The sensor system of claim 1, further comprising:
a controller;

a sense node coupled to the controller and the first supply terminal; and a resistor coupled between the first supply terminal and a power supply configured to provide the first supply potential, wherein the resistor is configured to conduct the first current to generate a voltage at the sense node, wherein the first current modulator component is configured to modulate the voltage by modulating the first current flowing along the first current path.

15. The sensor system of claim 14, wherein the controller is configured to decode a modulation of the voltage to obtain the diagnostic information.

16. The sensor system of claim 1, further comprising:
a controller;

a sense node coupled to the controller and the second supply terminal; and a resistor coupled between the second supply terminal and a power supply configured to provide the second supply potential, wherein the resistor is configured to conduct the first current to generate a voltage at the sense node, wherein the first current modulator component is configured to modulate the voltage by modulating the first current flowing along the first current path.

17. The sensor system of claim 16, wherein the controller is configured to decode a modulation of the voltage to obtain the diagnostic information.

18. The sensor system of claim 1, wherein the first current modulator component is configured to modulate a voltage at the first supply terminal or at the second supply terminal by modulating the first current flowing along the first current path.

19. The sensor system of claim 1, wherein the diagnostic circuit includes an internal control terminal and is configured to generate, based on the diagnostic information, a control signal at the internal control terminal for controlling the first current modulator component, and wherein the output terminal is not used for controlling the first current modulator component.

20. A three-terminal packaged device, comprising:
a package casing;

a first supply terminal arranged at the package casing and configured to be coupled to a first supply potential;

a second supply terminal arranged at the package casing and configured to be coupled to a second supply potential;

an output terminal arranged at the package casing and configured to provide an output signal modulated based on output information; and an integrated circuit that is encapsulated by the package casing, wherein the integrated circuit is coupled to the first supply terminal, the second supply terminal, and the output terminal, and wherein the integrated circuit comprises:

a processing circuit configured to generate the output information;

a current path coupled between the first supply terminal and the second supply terminal, wherein the current path is configured to enable a current to flow along the current path from the first supply terminal to the second supply terminal;

a current modulator component arranged in the current path, wherein the current modulator component is configured to modulate a voltage at the first supply terminal or at the second supply terminal by modulating the current flowing along the current path; and a diagnostic circuit configured to evaluate one or more fault conditions of the integrated circuit, generate diagnostic information based on the one or more fault conditions of the integrated circuit, and control the current modulator component such that the current is modulated based on the diagnostic information, wherein the diagnostic circuit includes an internal control terminal and is configured to generate, based on the diagnostic information, a control signal at the internal control terminal for controlling the current modulator component, and wherein the output terminal is not used for controlling the current modulator component.

21. A method of providing diagnostic information from a three-terminal packaged device, the method comprising:

providing a first supply potential to a first supply terminal of the three-terminal packaged device;

providing a second supply potential to a second supply terminal of the three-terminal packaged device;

generating a sensor signal based on a sensed property;

generating an output signal at an output terminal based on the sensor signal;

evaluating a diagnostic condition of the three-terminal packaged device; and modulating a voltage at the first supply terminal or at the second supply terminal by modulating a current flowing between the first supply terminal and the second supply terminal, wherein the current is modulated based on a status of the diagnostic condition, wherein the sensor signal is generated by a sensing element, wherein the status of the diagnostic condition is a status of the sensing element, and wherein evaluating the diagnostic condition includes evaluating a condition of the sensing element, including whether the sensing element is in a faulty state, for determining the status of the sensing element.

22. A method of providing diagnostic information from a three-terminal packaged device, the method comprising:

providing a first supply potential to a first supply terminal of the three-terminal packaged device;

providing a second supply potential to a second supply terminal of the three-terminal packaged device;

generating a sensor signal based on a sensed property;

generating an output signal at an output terminal based on the sensor signal;

evaluating a diagnostic condition of the three-terminal packaged device; and modulating a voltage at the first supply terminal or at the second supply terminal by modulating a current flowing between the first supply terminal and the second supply terminal, wherein the current is modulated based on a status of the diagnostic condition, and wherein the three-terminal packaged device includes a package casing with only three external terminals that connect the package casing to external components that are external to the package casing, the three external terminals including the first supply terminal, the second supply terminal, and the output terminal.

* * * * *